United States Patent

Kitaguchi et al.

[11] Patent Number: 6,040,614
[45] Date of Patent: Mar. 21, 2000

[54] SEMICONDUCTOR INTEGRATED CIRCUIT INCLUDING A CAPACITOR AND A FUSE ELEMENT

[75] Inventors: Akira Kitaguchi; Makoto Hatakenaka; Michio Nakajima; Kaoru Motonami, all of Tokyo; Kiyoyuki Shiroshima, Hyogo; Takekazu Yamashita, Nagasaki, all of Japan

[73] Assignees: Mitsubishi Denki Kabushiki Kaisha, Tokyo; Mitsubishi Electric System LSI Design Corporation, Hyogo, both of Japan

[21] Appl. No.: 09/033,611

[22] Filed: Mar. 3, 1998

[30] Foreign Application Priority Data

Sep. 2, 1997 [JP] Japan .................................. 9-237391

[51] Int. Cl.$^7$ .................................................. H01L 29/40
[52] U.S. Cl. .......................................... 257/529; 257/532
[58] Field of Search .................................... 257/529, 665; 438/467

[56] References Cited

U.S. PATENT DOCUMENTS

| 5,047,826 | 9/1991 | Keller et al. | 257/379 |
| 5,252,844 | 10/1993 | Takagi | 257/296 |
| 5,627,400 | 5/1997 | Koga | 257/529 |
| 5,789,788 | 8/1998 | Ema et al. | 257/529 |

FOREIGN PATENT DOCUMENTS 60-98665  6/1985  Japan .

*Primary Examiner*—David B. Hardy
*Attorney, Agent, or Firm*—Leydig, Voit & Mayer, Ltd.

[57] ABSTRACT

A semiconductor integrated circuit includes a fuse element located on an insulating layer. The surface of the insulating layer is substantially smooth. The insulating layer is located over a capacitor. Wiring is located on the insulation layer. The fuse element and the wiring include the same material.

5 Claims, 11 Drawing Sheets

SEMICONDUCTOR INTEGRATED CIRCUIT INCLUDING A CAPACITOR AND A FUSE ELEMENT

BACKGROUND OF THE INVENTION

1. Field of the Invention

The present invention relates to a semiconductor integrated circuit such as a dynamic random access memory (DRAM) in which a plurality of memory elements (memory cells) using capacitors and a fabrication method therefor, and, more particularly, to a semiconductor integrated circuit such as a DRAM having redundancy circuits that are incorporated in the semiconductor integrated circuit in order to prevent decreasing of the yield of semiconductor integrated circuits caused by wafer defects by electrically connecting or disconnecting the redundancy circuits based on connecting or cutting of fuse elements.

2. Description of the Prior Art

FIG. 8 is a diagram showing a sectional view of a conventional dynamic random access memory (DRAM) fabricated by using the technique disclosed in the Japanese laid open publication number JP-A-60/98665. In FIG. 8, the reference number 1 designates a semiconductor substrate on which semiconductor elements such as capacitors, resistors, and the like are formed, 2 denotes one electrode of a capacitor, 3 indicates an insulating layer in the capacitor, and 4 designates other electrode of the capacitor. The reference number 5 designates word lines and 6 indicates bit lines. The reference number 7 designates a first wiring of aluminum, 8 indicates a second wiring of aluminum. The reference number 9 designates a fuse element connected to the first wiring 7. The reference numbers 10 to 15 designate insulating layers for electrical insulating those circuit elements from each other such as the capacitors, for example.

The fuse element 9 is formed in a fabrication process for the bit lines 6 simultaneously. FIG. 8 shows only one fuse element for brevity. The left half in FIG. 8 designates a memory cell in which the capacitor including the electrodes 2 and 4 and the insulating layer 4 is located. The right half in FIG. 8 indicates a wiring section in which the fuse element 9 is included.

Next, a description will be given of the operation of the conventional semiconductor integrated circuit shown in FIG. 8.

When information is stored in the DRAM shown in FIG. 8, at first, a voltage corresponding to the information to be stored is supplied to the word line 5 through the first line and the second line 8. Then, a channel is formed between the semiconductor substrate 1 corresponding to the word line 5 and the electrode 2 of the capacitor, and a current flows to the electrode 2 of the capacitor from the word line 5 through the semiconductor substrate 1. After this, when the voltage supply to the word line 5 is stopped, electrical charge corresponding to the applied voltage is stored between the electrode 2 of the capacitor and the electrode 4 of the capacitor.

In addition, when information is read from the DRAM shown in FIG. 8, a voltage is supplied to the word line 5 through the first and second lines 7 and 8. Thereby, a channel is formed in a section between the word line 5 and the electrode 2 in the semiconductor substrate 1. Thereby, a current flows to the word line 5 from the electrode 2 in the capacitor through the semiconductor substrate 1. The value of the stored information is detected based on the magnitude of this current flow.

Next, a description will be given of the function of the fuse 9.

In general, defects in the wafer are generated in at a constant probability during a semiconductor fabrication process. This prevents increasing of the yield percentage. That is, there is a drawback that it is difficult to increase the yield percentage of the semiconductor fabrication process. In other words, there is the drawback that the yield rate of the semiconductor fabrication process is limited. In order to avoid this drawback, redundancy circuits are incorporated in each semiconductor integrated circuit such as DRAM and the like. For example, the redundancy circuits a DRAM are memory cells. When a defect of a memory cell is caused in a semiconductor integrated circuit fabricated during the semiconductor fabrication process, the memory cell as a defect circuit is replaced with a redundancy circuit by electrically connecting this redundancy circuit. This method prevents the decreasing of yield rate of the semiconductor integrated circuit. A plurality of fuse elements are incorporated in each semiconductor integrated circuit in order to increase the yield rate. The fuse is cut by using irradiation of a laser beam in order to replace a defective circuit with the redundant circuit (such as an added memory cell). This method may be used to increase the yield rate of semiconductor integrated circuits.

Because the conventional semiconductor integrated circuit has the above configuration, the level of the surface of the insulating layer 14 on the capacitor, made up of the electrodes 2 and 4 and the layer 3 in the memory section (see the left half in FIG. 8), is different from the level of the surface of the insulating layer 14 in the wiring section (see the right half in FIG. 8). In this case, as shown in FIG. 9, although a laser beam to be used for etching process for each layer is focused in one section (for example, the memory cell section), the laser beam is not focused (namely it causes off-focus) in other section (for example, the wiring section). Accordingly, it is difficult to form correctly the width of each wiring in the wiring section in off-focus section. Taking a concrete example, because the off-focus is caused in the wiring section in the semiconductor integrated circuit shown in FIG. 8, as shown in the right half in FIG. 9, the width of a wiring is increased from W1 to SW2 (W2<W1). This increased width prevents increasing of the semiconductor integration.

In order to avoid the above conventional drawback, as shown in FIG. 10, there is a conventional method in which the thickness of the insulating layer 14 on the capacitor made up of the electrodes 2 and 4 and the layer 3 is increased in order that the surfaces of both the memory cell section (see the left half in FIG. 10) and the wiring section (see the right half in FIG. 10) having the same level. However, this conventional fabrication method causes a drawback in which the depth d2 of the fuse 9, measured from the surface of a semiconductor chip, becomes larger (see d2>d1 in FIGS. 10, 11A, and 11B) than the depth d1 of the fuse 9 in the conventional semiconductor integrated circuit shown in FIG. 8. As a result, it is required to blow a laser beam deep in the semiconductor integrated circuit having the configuration shown in FIG. 11B. This causes an increase the length by the blowing time of the laser beam and increases the diameter of a hole formed by blowing of the laser beam. In order to avoid the drawback, it is required to increase a fabrication interval (W4) of the fuses 9. However, this prevents the integration of the semiconductor integrated circuit. That is, this becomes one of factors preventing increasing of the integration of the semiconductor integrated circuit.

SUMMARY OF THE INVENTION

Accordingly, an object of the present invention is, with due consideration to the drawbacks of the conventional semiconductor integrated circuit and a fabrication method therefor, to provide a semiconductor integrated circuit and a fabrication method therefor in which it may be easily performed to blow each fuse element by using a laser beam in order to electrically connect each redundant circuit such as redundant memory cells even if the semiconductor integrated circuit includes capacitances.

In accordance with a preferred embodiment of the present invention, a semiconductor fabrication method, comprises the steps of a capacitor fabrication method for forming a capacitor on a semiconductor substrate, an insulating layer fabrication process for forming aan insulating layer on the capacitor and the semiconductor substrate, and a fuse fabrication process for forming a fuse element on the insulating layer in a laminating direction.

In the semiconductor fabrication method as another preferred embodiment of the present invention, the insulating layer fabrication process for forming the insulating layer on the capacitor and the semiconductor substrate comprises an insulating layer laminating process for laminating the insulating layer whose thickness is thicker than the thickness of the capacitor and a smoothing process for smoothing a surface of the insulating layer by using a chemical mechanical polishing process.

In the semiconductor fabrication method as another preferred embodiment of the present invention, the fuse element is formed in a wiring fabrication process in which wirings are fabricated.

In the semiconductor fabrication method as another preferred embodiment of the present invention, the fuse element is formed in a layer to a layer wiring fabrication process for forming a layer to layer wiring connecting among different wiring layers in the wiring fabrication process for forming the wirings.

In accordance with another preferred embodiment of the present invention, a semiconductor integrated circuit comprises a semiconductor substrate, a capacitor formed on the semiconductor substrate, an insulating layer laminated on the capacitor and the semiconductor substrate, and a fuse element formed on the insulating layer in laminating direction.

In the semiconductor integrated circuit as another preferred embodiment of the present invention, wirings are formed on the capacitor in the laminating direction, and the fuse element is made up of a same material forming the wirings.

In the semiconductor integrated circuit as another preferred embodiment of the present invention, a plurality of first wiring layers are formed over the capacitor and on the insulating layer in the laminating direction, and first layer to layer wirings connecting among the plurality of first wiring layers are formed in the insulating layer, wherein the fuse element is made up of a same material of the first layer to layer wirings.

In the semiconductor integrated circuit as another preferred embodiment of the present invention, a plurality of second wiring layers are formed over the capacitor and on the insulating layer in the laminating direction, and second layer to layer wirings connecting among the plurality of second wiring layers are formed in the insulating layer, wherein the fuse element is made up of a same material of the second layer to layer wirings.

In the semiconductor integrated circuit as another preferred embodiment of the present invention, a plurality of first wiring layers are formed over the capacitor and on the insulating layer in the laminating direction, and first layer to layer wirings connecting among the plurality of first wiring layers are formed in the insulating layer, a plurality of second wiring layers are formed over the capacitor and on the insulating layer in the laminating direction, and second layer to layer wirings connecting among the plurality of second wiring layers are formed in the insulating layer, wherein the fuse element is made up of a same material of the first layer to layer wirings or the second layer to layer wirings.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a semiconductor integrated circuit and a fabrication method therefor according to the present invention will now be described with reference to the drawings.

First Embodiment

Figure 1:
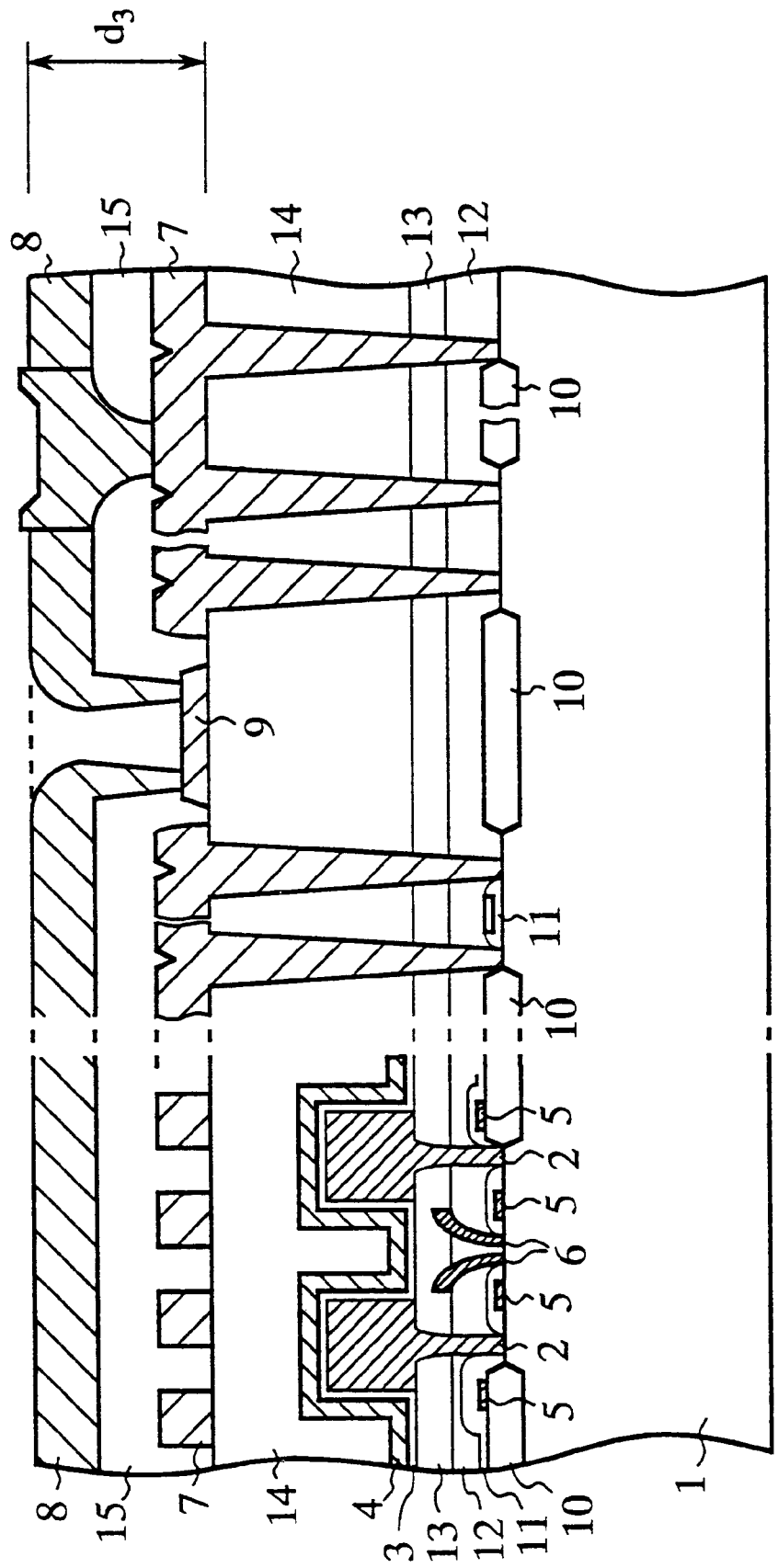
FIG. 1 is a diagram showing a sectional view of a semiconductor integrated circuit (DRAM) as a first embodiment according to the present invention.
Figure 2:
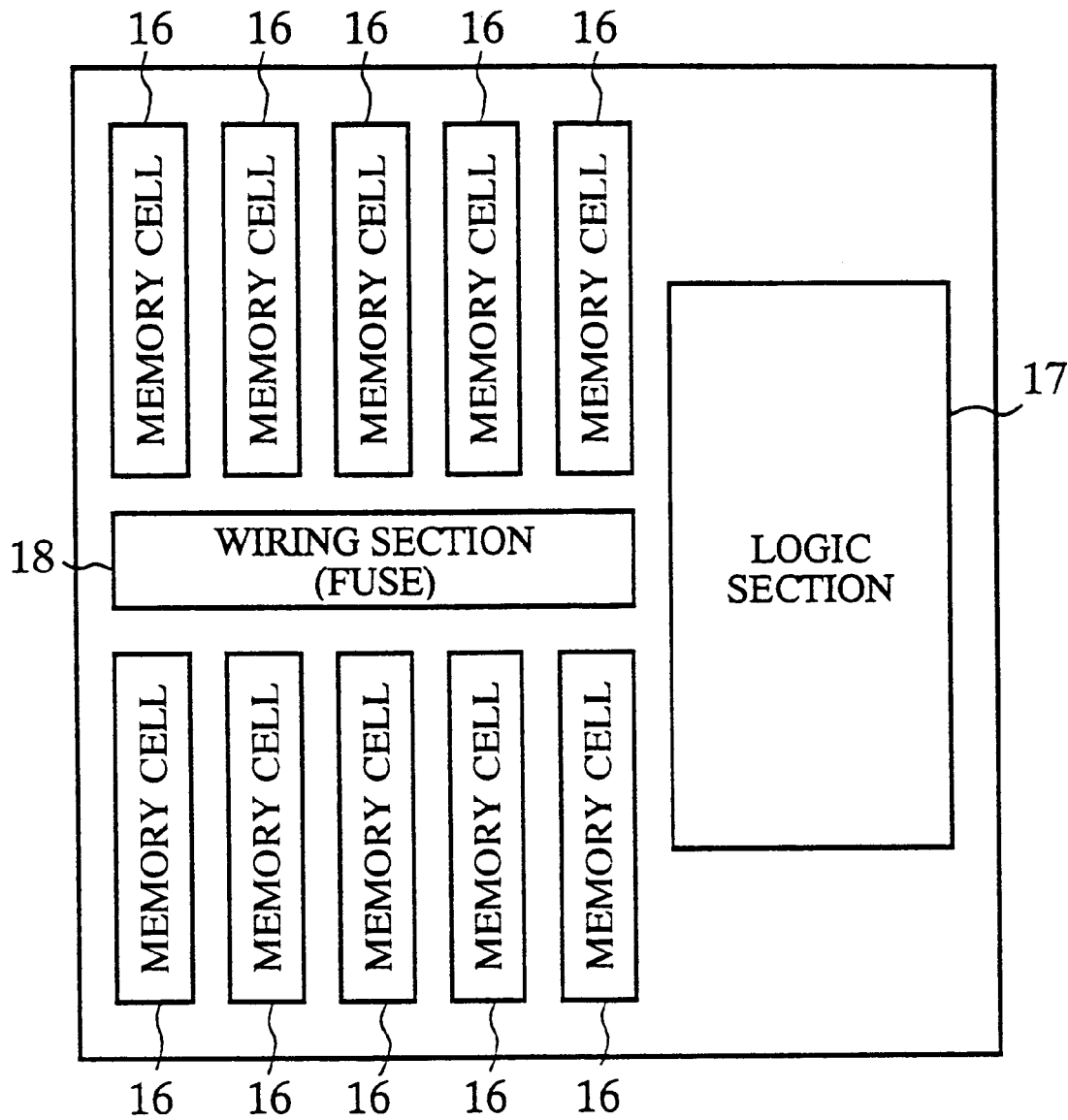
FIG. 2 is a diagram showing a layout of a chip of the semiconductor integrated circuit (DRAM) as the first to fourth embodiments according to the present invention.

FIG. 2 is a diagram showing a layout of a semiconductor chip of a semiconductor integrated circuit (DRAM) as each of the first to fourth embodiments according to the present invention as shown in following FIG. 1, FIGS. 3A to 3D, and FIGS. 4 to 7.

In FIG. 2, the reference number 16 designates memory cells. In each of the memory cells, a plurality of capacitors are arranged. The reference number 17 designates a logic section for performing a logical calculation for input data items. The reference number 18 denotes a wiring section in which a plurality of wires (or lines) are formed. The plurality of memory cells as the plurality of capacitors are connected to logical section 17 and external connection terminals (not shown) through those lines formed in the wiring section.

Some memory cells in the plurality of memory cells are used as redundancy circuits and a plurality of fuse elements are formed in the wiring section in order to electrically connect the redundancy circuits.

FIG. 1 is a diagram showing a sectional view of the semiconductor integrated circuit (DRAM) as the first embodiment according to the present invention. In FIG. 1, the reference number 1 designates a semiconductor substrate on which semiconductor elements such as semiconductor elements, resistor elements, and the like are formed, 2 denotes one electrode of a capacitor, 3 indicates an insulating layer in the capacitor, and 4 designates other electrode of the capacitor. The reference number 5 designates word lines and 6 indicates bit lines. The reference number 7 designates each first line (each first wiring), 8 indicates each second line (each second wiring). The reference number 9 designates a fuse element connected to the second line (second wiring) 8. In FIG. 1, only one fuse element 9 is shown for brevity. The reference numbers 10 to 15 designate insulating layers for electrically insulating those conductivity materials to each other.

The left half in FIG. 1 shows a sectional view of a memory cell in which the capacitor including the electrodes 2, 4 and the insulating layer 3 is formed. The right half in FIG. 1 shows a sectional view of a wiring section in which the fuse element 9 is formed. In general, the described capacitor made up of layers laminated in a vertical direction, is called to as a stacked capacitor.

Figure 3A:
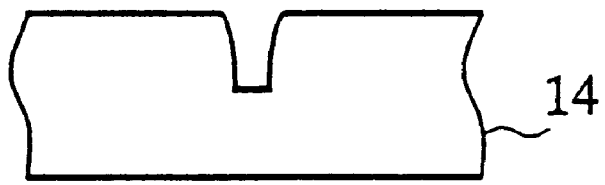
FIGS. 3A to 3D show fabrication processes forming a first wiring and a fuse element in the semiconductor integrated circuit of the first embodiment shown in FIG. 1.
Figure 3B:
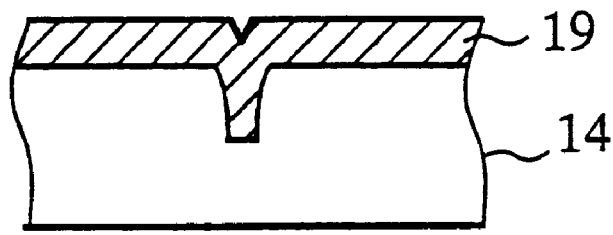
Figure 3C:
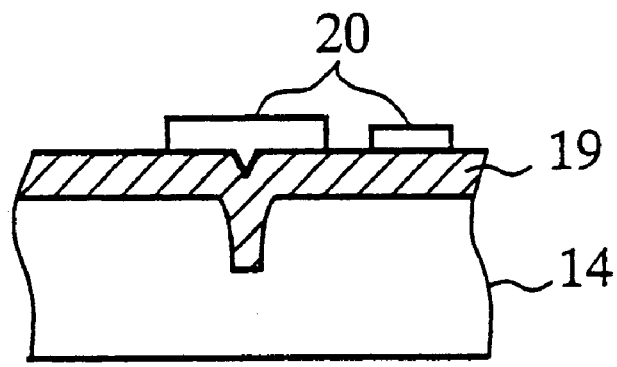
Figure 3D:
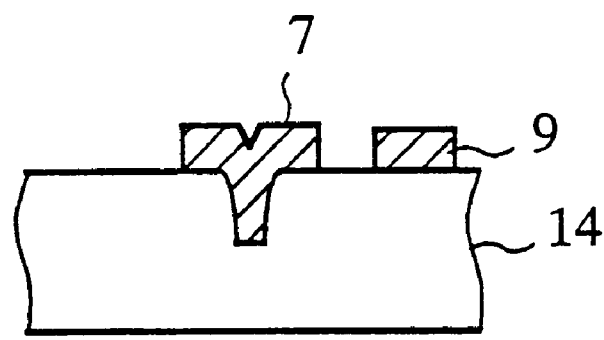

FIGS. 3A to 3D show fabrication processes to form each first line (each first wiring) 7 and each fuse element 9 in the semiconductor integrated circuit of the first embodiment shown in FIG. 1. FIG. 3A is a diagram showing a first process to form a hole in the insulating film 14 formed on the capacitor made up of the electrodes 2 and 4 and the insulating layer 3. FIG. 3B is a diagram showing a lamination process to form a lamination of a tungsten layer or a poly-silicon layer 19 on the insulating layer 14. FIG. 3C is a diagram showing a resist film forming process to form a predetermined resist film 20 on the tungsten layer or the poly-silicon layer 19. FIG. 3D is a diagram showing an etching process for etching the tungsten or poly-silicon layer 19 on which the resist film has not been laminated. Then, the first line 7 in the tungsten or poly-silicon layer and the fuse element 9 laminated on the insulating layer 14 are formed.

Furthermore, as shown in FIGS. 1 and 3A–3D, chemical mechanical polishing process makes smooth the surface of the insulating layer 14 after the insulating layer 14 is formed to cover both the semiconductor substrate 1 and the capacitors made up of the elements 2, 3, and 4.

Next, a description will be given of the operation of the semiconductor integrated circuit as the first embodiment shown in FIG. 1.

When information is stored in the DRAM having the configuration described above, at first, a voltage corresponding to the information to be stored is provided to the word line 5 through the first line and the second line 8. Then, a channel is formed between the semiconductor substrate 1 corresponding to the word line 5 and the electrode 2 of the capacitor, a current flows to the electrode 2 of the capacitor from the word line 5 through the semiconductor substrate 1. After this, when the voltage supply to the word line 5 is stopped, electrical charge corresponding to the applied voltage is stored between the electrode 2 of the capacitor and other electrode 4 of the capacitor.

In addition, when information is read from the DRAM shown in FIG. 1, a voltage is supplied to the word line 5 through the first and second lines 7 and 8. Thereby, a channel is formed in a section between the word line 5 and the electrode 2 in the semiconductor substrate 1. Thereby, a current flows to the word line 5 from the electrode 2 in the capacitor through the semiconductor substrate 1. The value of the stored information is detected based on the magnitude of this current flow.

When a laser beam blows the fuse element 9 in the DRAM shown in FIG. 1, a hole is formed in the fuse element 9. The diameter of the hole is approximately equal to the hole formed in the conventional one. Accordingly, it is possible to increase the integration of the semiconductor integrated circuit, namely to increase the integration of the DRAM having the configuration shown in FIG. 1 because it is not required to increase the interval between adjacent fuse elements. Furthermore, because it is not required to blow the fuse element 9 in depth, the blowing time of the laser beam to the fuse element 9 can be reduced.

As described above, because the semiconductor integrated circuit of the first embodiment has the configuration in which the surface of the insulating layer 14 formed on the semiconductor substrate 1 and the capacitor made up of the electrodes 2 and 4 and the insulating layer 3 is approximately smoothed by using the chemical mechanical polishing process, and because the fuse element 9 is formed over the insulating layer 14 in a laminating direction, it is possible to increase the integration of the semiconductor integrated circuit. In other words, it is possible to form both the memory cell sections 16 and the logical section 17 in the same semiconductor chip without preventing a high integration of the logical section 17 shown in FIG. 2. This semiconductor memory of a high integration including mixed logic section without any influence caused by holes generated by an off-focus of the laser beam and a laser blowing process.

Furthermore, in the semiconductor fabrication method according to the first embodiment, because both the fuse element 9 and the first lines 7 are formed in the same fabrication process, it is possible to reduce the number of fabrication processes when compared with the conventional fabrication method in which a dedicated fabrication process for the fuse 9 is required.

Second Embodiment

Figure 4:
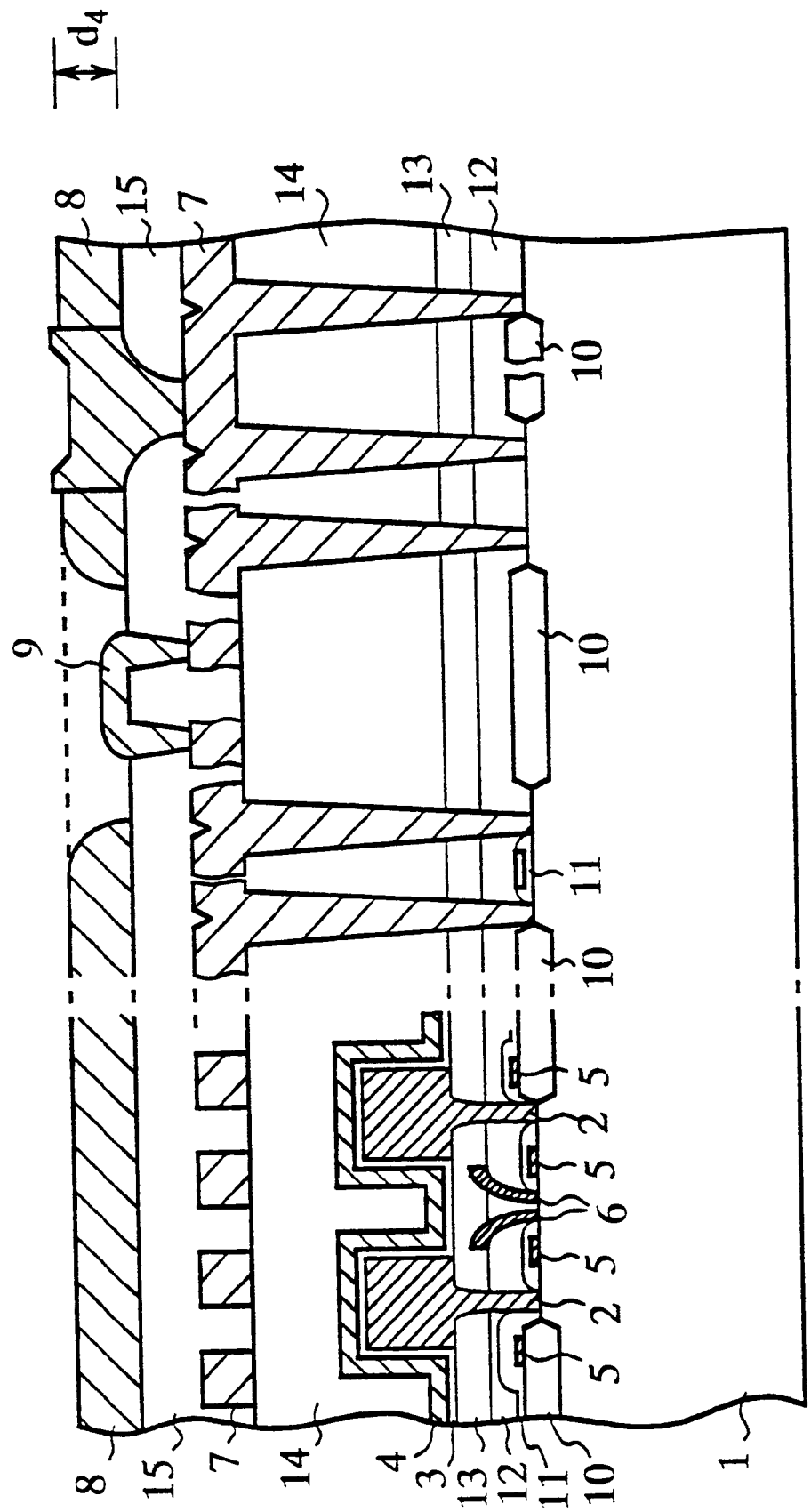
FIG. 4 is a diagram showing a sectional view of a semiconductor integrated circuit (DRAM) as a second embodiment according to the present invention.

FIG. 4 is a diagram showing a sectional view of the semiconductor integrated circuit (DRAM) as the second embodiment according to the present invention.

In FIG. 4, the reference number 9 designates a fuse element formed in a same fabrication process as the second line 8. The fuse 9 shown in FIG. 4 is also formed at the same level of the second line 8. Other components of the DRAM of the second embodiment are the same as those of the DRAM of the first embodiment. Therefore the same reference numbers of the same components will be used and the explanation of them is omitted here for brevity.

In the DRAM of the second embodiment shown in FIG. 4, when a laser beam blows the fuse element 9, a hole is formed in the fuse element 9. The diameter of the hole in the DRAM is approximately equal to the hole formed in the conventional one. Accordingly, it is possible to increase the integration of the semiconductor integrated circuit, namely the DRAM having the configuration shown in FIG. 4. because it is not required to increase the interval between adjacent fuse elements. Furthermore, because it is not required to blow the fuse element 9 shown in FIG. 4 in depth, the blowing time of the laser beam to the fuse element 9 can be reduced.

As described above, because the semiconductor integrated circuit of the second embodiment has the configuration shown in FIG. 4 in which the surface of the insulating layer 14 formed on the semiconductor substrate 1 and the capacitor made up of the electrodes 2 and 4 and the insulating layer 3 is approximately smoothed by using the chemical mechanical polishing process, and because the fuse element 9 shown in FIG. 4 is formed on the insulating layer 14 in a laminating direction, it is possible to increase the integration of the semiconductor integrated circuit without any influence caused by holes generated by an off-focus of the laser beam and a laser blowing process. Accordingly, it is possible to form both the memory cell sections and the logical section in the same semiconductor chip without preventing a high integration of the logical section. This provide a semiconductor memory of high integration including a mixed logic section.

Furthermore, in the semiconductor fabrication method according to the second embodiment, because both the fuse element 9 shown in FIG. 4 and the second lines 8 are formed in a same fabrication process, it is possible to reduce the number of fabrication processes when compared with the conventional fabrication method in which a dedicated fabrication process for the fuse 9 must be required.

Third Embodiment

Figure 5:
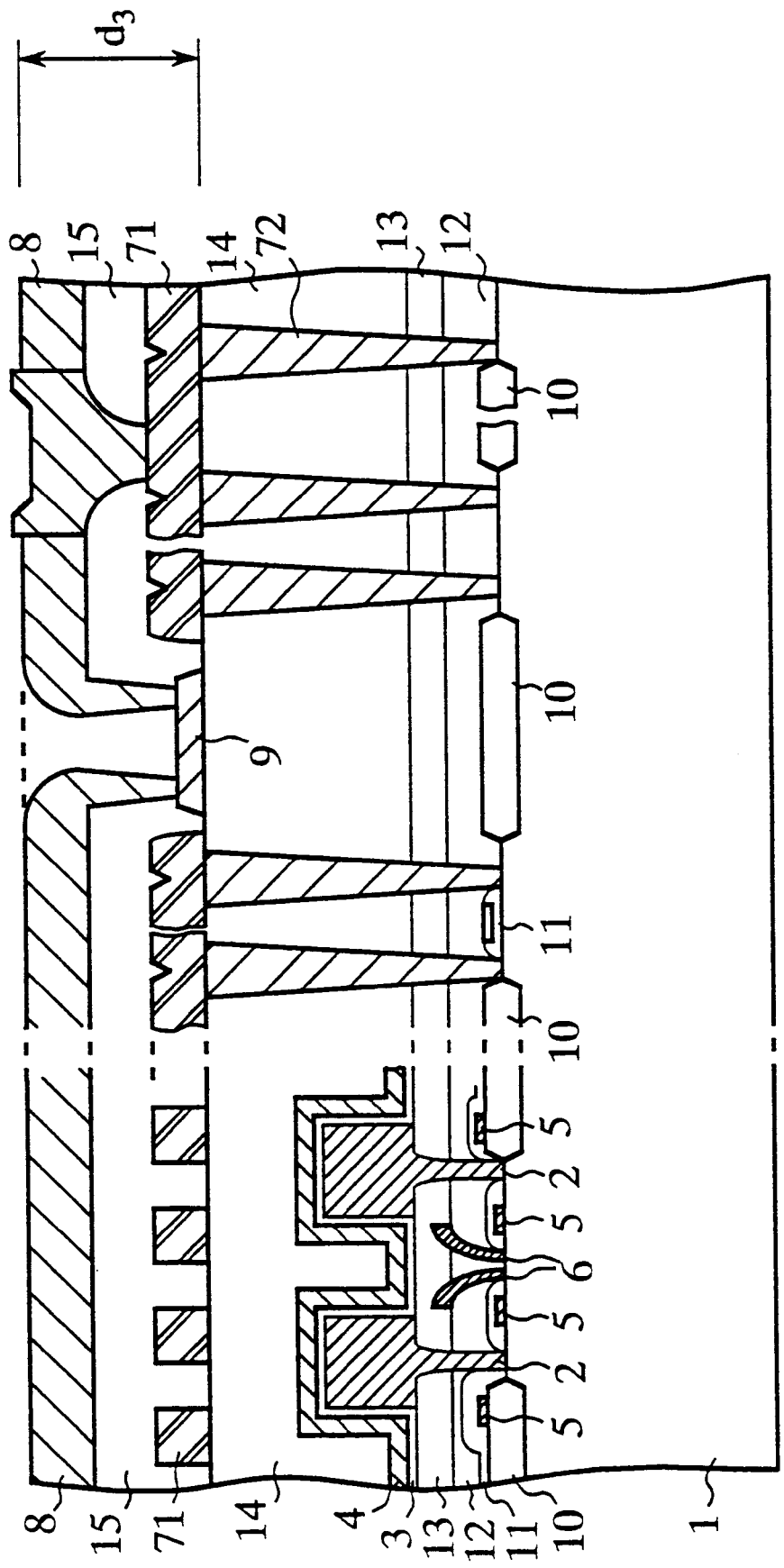
FIG. 5 is a diagram showing a sectional view of a semiconductor integrated circuit (DRAM) as a third embodiment according to the present invention.

FIG. 5 is a diagram showing a sectional view of the semiconductor integrated circuit (DRAM) as the third embodiment according to the present invention. In FIG. 5, the reference number 71 designates a first line layer formed on the insulating layer 14, and 72 denotes a first layer to layer line, made up of tungsten or poly-silicon, that electrically connects the first line layer 71 and the semiconductor substrate 1.

In the DRAM of the third embodiment shown in FIG. 5, the first line 7 comprises the first line layer 71 and the first layer to layer line 72. Other components of the DRAM of the third embodiment are the same as those of the DRAM of the first embodiment. Therefore the same reference numbers of the same components will be used and the explanation of them is omitted here for brevity.

FIGS. 6A to 6G show fabrication processes to form each first line layer 71, each first layer to layer line 72, and each fuse element 9 in the semiconductor integrated circuit of the third embodiment shown in FIG. 5.

Figure 6A:
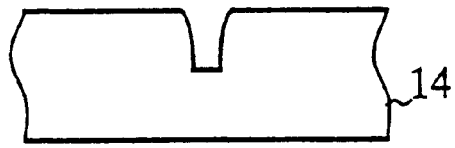
FIGS. 6A to 6G show fabrication processes forming a first wiring and a fuse element in the semiconductor integrated circuit as the third embodiment shown in FIG. 5.
Figure 6B:
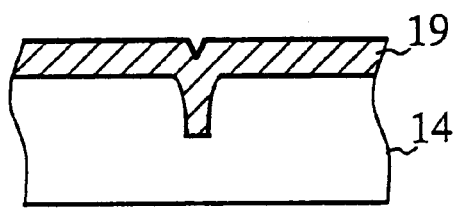
Figure 6C:
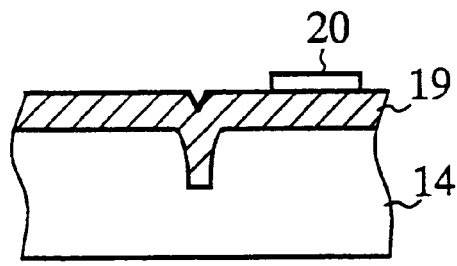
Figure 6D:
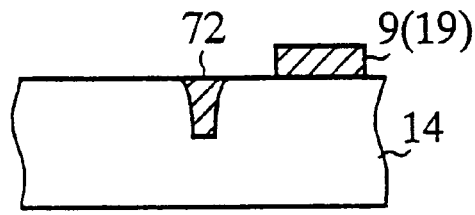
Figure 6E:
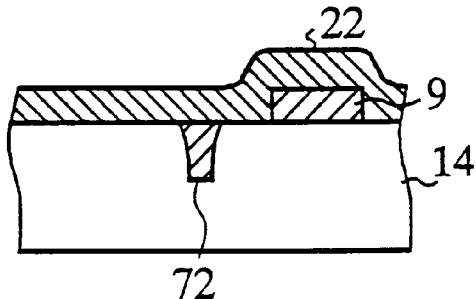
Figure 6F:
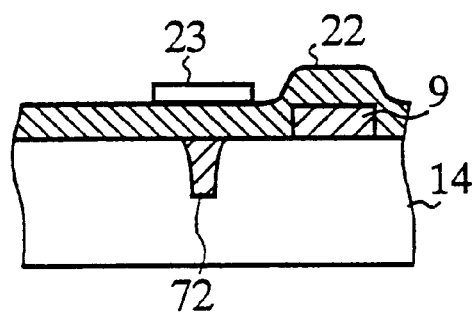
Figure 6G:
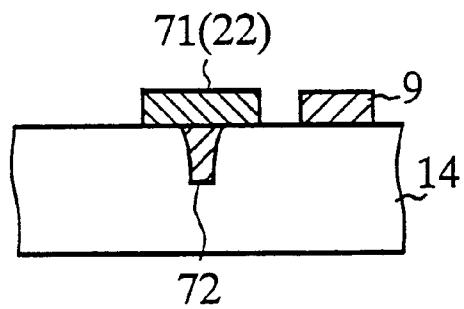

FIG. 6A is a diagram showing a first process to form a hole in the insulating film 14 formed on the capacitor made up of the electrodes 2 and 4 and the insulating layer 3. FIG. 6B is a diagram showing a first lamination process to form a lamination of a tungsten layer or a poly-silicon layer 19 on the insulating layer 14. FIG. 6C is a diagram showing a first resist film forming process to form a predetermined resist film 20 on the tungsten layer or the poly-silicon layer 19. FIG. 6D is a diagram showing a first etching process for etching the tungsten layer or poly-silicon layer 19 on which the resist film has not been laminated. After this process, the tungsten layer or the poly-silicon layer 19 in the hole 72 formed in the insulating layer 14 and the fuse element 9 (19)

are formed. FIG. 6E is a diagram showing a second lamination process to form an aluminum layer 22 laminated on the insulating layer 14. FIG. 6F is a diagram showing a second resist film fabrication process to form a predetermined resist film 23 on the aluminum layer 22. FIG. 6G is a diagram showing a second etching process for etching the aluminum layer 22 on which the resist film has not been laminated. After those fabrication processes have been completed, the tungsten layer or the poly-silicon layer 19 formed in the hole in the insulating layer 14 becomes the first layer to layer line 72, the tungsten or the poly-silicon layer 19 formed on the insulating layer 14 becomes the fuse element 9, and the aluminum layer 22 formed on the insulating layer 14 becomes the first line layer 71.

In the DRAM of the third embodiment having the configuration fabricated by the above fabrication method, when a laser beam blows the fuse element 9 in the DRAM shown in FIG. 5, a hole is formed in the fuse element 9. The diameter of the hole is approximately equal to the hole formed conventionally. Accordingly, it is possible to increase the integration of the semiconductor integrated circuit, namely the DRAM having the configuration shown in FIG. 5, because it is not required to increase the interval between adjacent fuse elements. Furthermore, because it is not required to blow the fuse element 9 in depth, the blowing time of the laser beam to the fuse element 9 can be reduced.

As described above, because the semiconductor integrated circuit of the third embodiment has the configuration in which the surface of the insulating layer 14 formed on the semiconductor substrate 1 and the capacitor made up of the electrodes 2 and 4 and the insulating layer 3 is approximately smoothed by using the chemical mechanical polishing process, and because the fuse element 9 is formed over the insulating layer 14 in a laminating direction, it is possible to increase the integration of the semiconductor integrated circuit without any influence caused by holes generated by an off-focus of the laser beam and a laser blowing process. Accordingly, it is possible to form both the memory cell sections 16 and the logical section 17 in the same semiconductor chip without preventing a high integration of the logical section 17 shown in FIG. 2. This provides a semiconductor memory of high integration including a mixed logic section without any influence caused by holes generated by an off-focus of the laser beam and a laser blowing process.

In addition, according to the third embodiment of the present invention, because the first line 7 comprises the first layer 71 made up of aluminum and the first layer to layer line 72 made up of tungsten or poly-silicon, the resistance of the first line 7 in the DRAM of the third embodiment is smaller than that of the first line in the DRAM as the first embodiment. It is thereby possible to obtain the same characteristic of the first line made up of only aluminum in a conventional semiconductor integrated circuit.

Furthermore, in the semiconductor fabrication method according to the third embodiment, because both the fuse element 9 and the first lines 7 are formed in a same fabrication process, it is possible to reduce the number of fabrication processes when compared with the conventional fabrication method in which a dedicated fabrication process for the fuse 9 is required.

Fourth Embodiment

Figure 7:
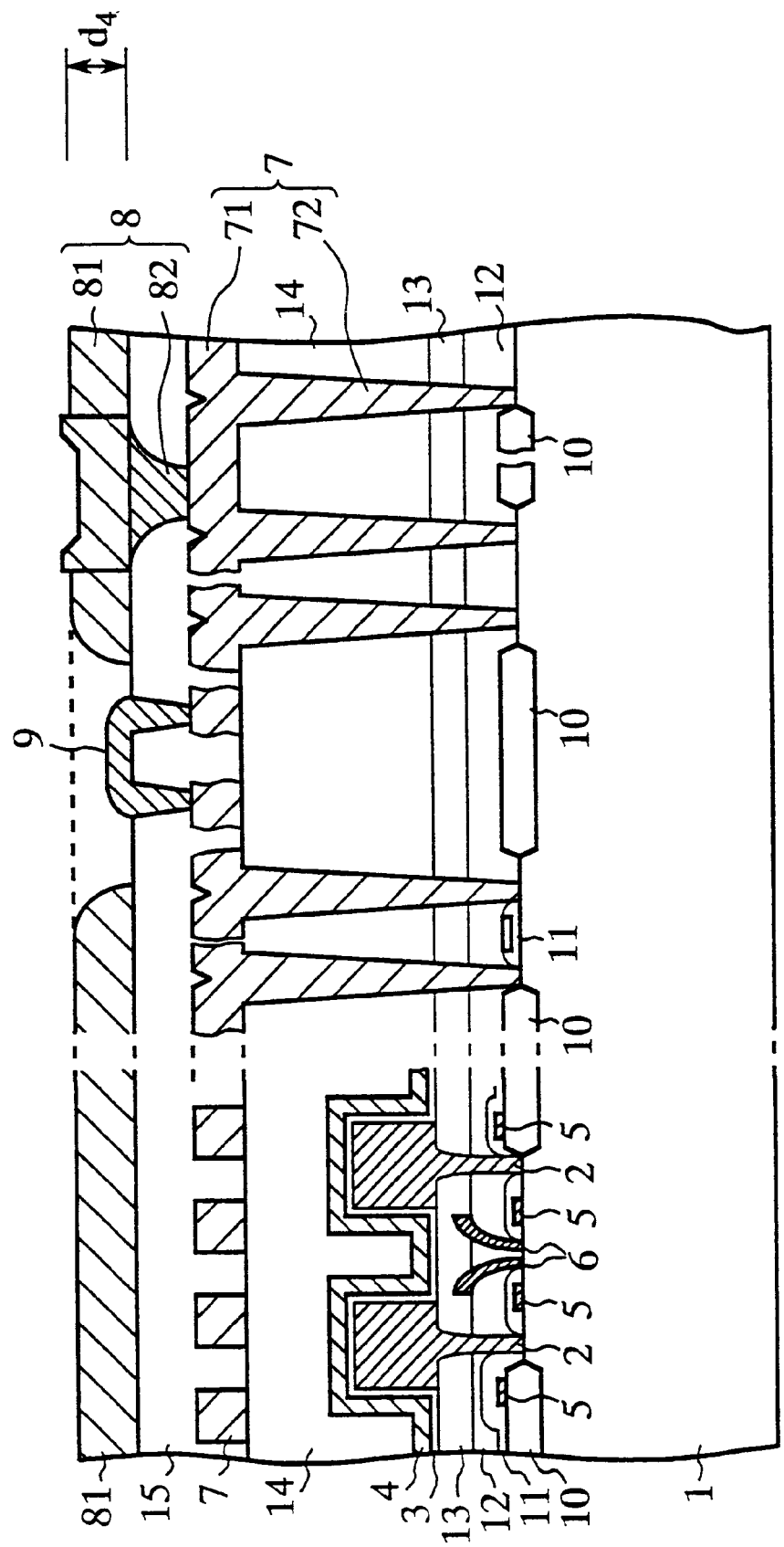
FIG. 7 is a diagram showing a sectional view of a semiconductor integrated circuit (DRAM) as a fourth embodiment according to the present invention.
Figure 8:
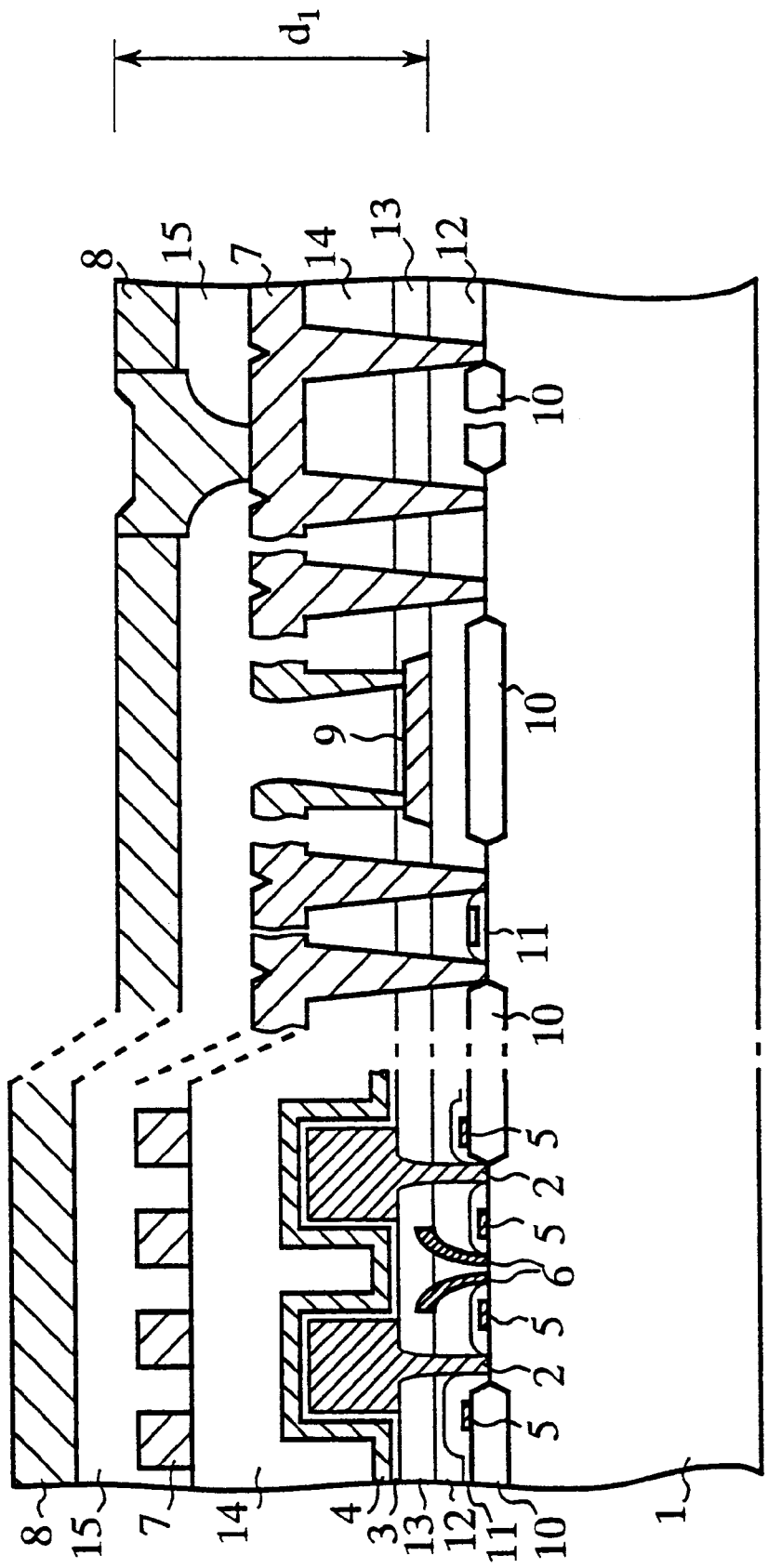
FIG. 8 is a diagram showing a sectional view of a conventional semiconductor integrated circuit (DRAM)
Figure 9:
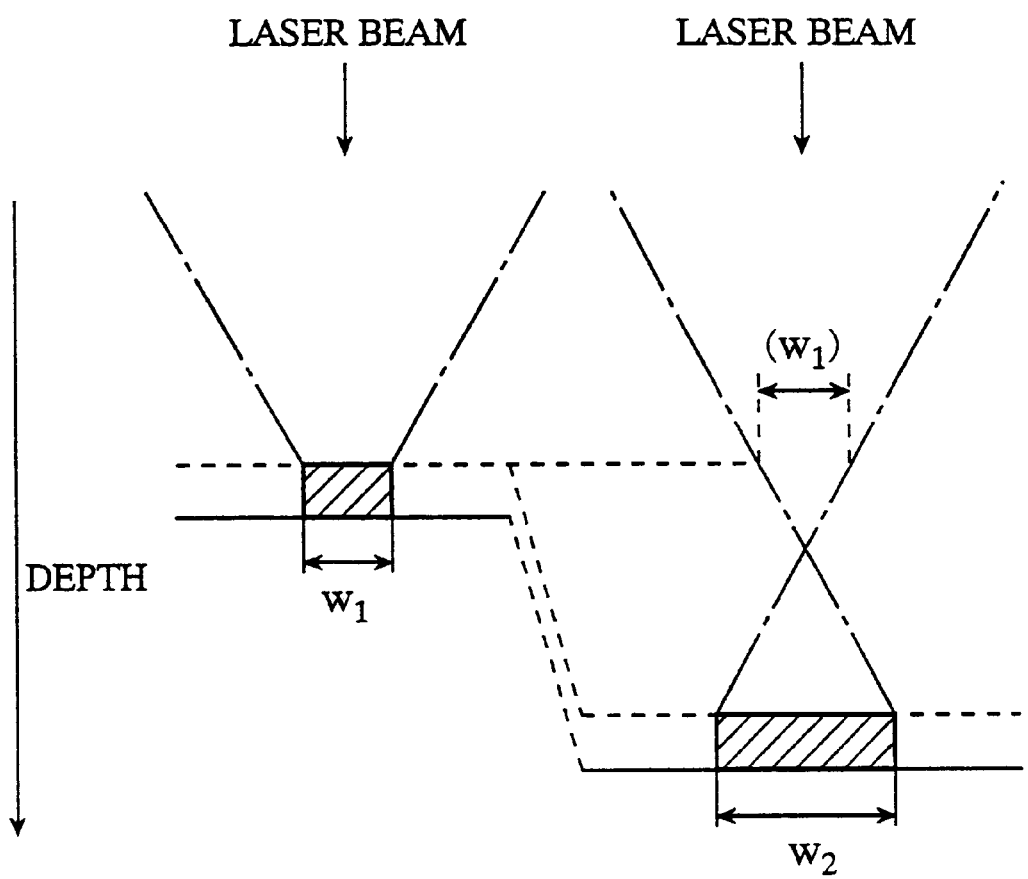
FIG. 9 is a diagram explaining a drawback involved in the conventional semiconductor integrated circuit shown in FIG. 8.
Figure 10:
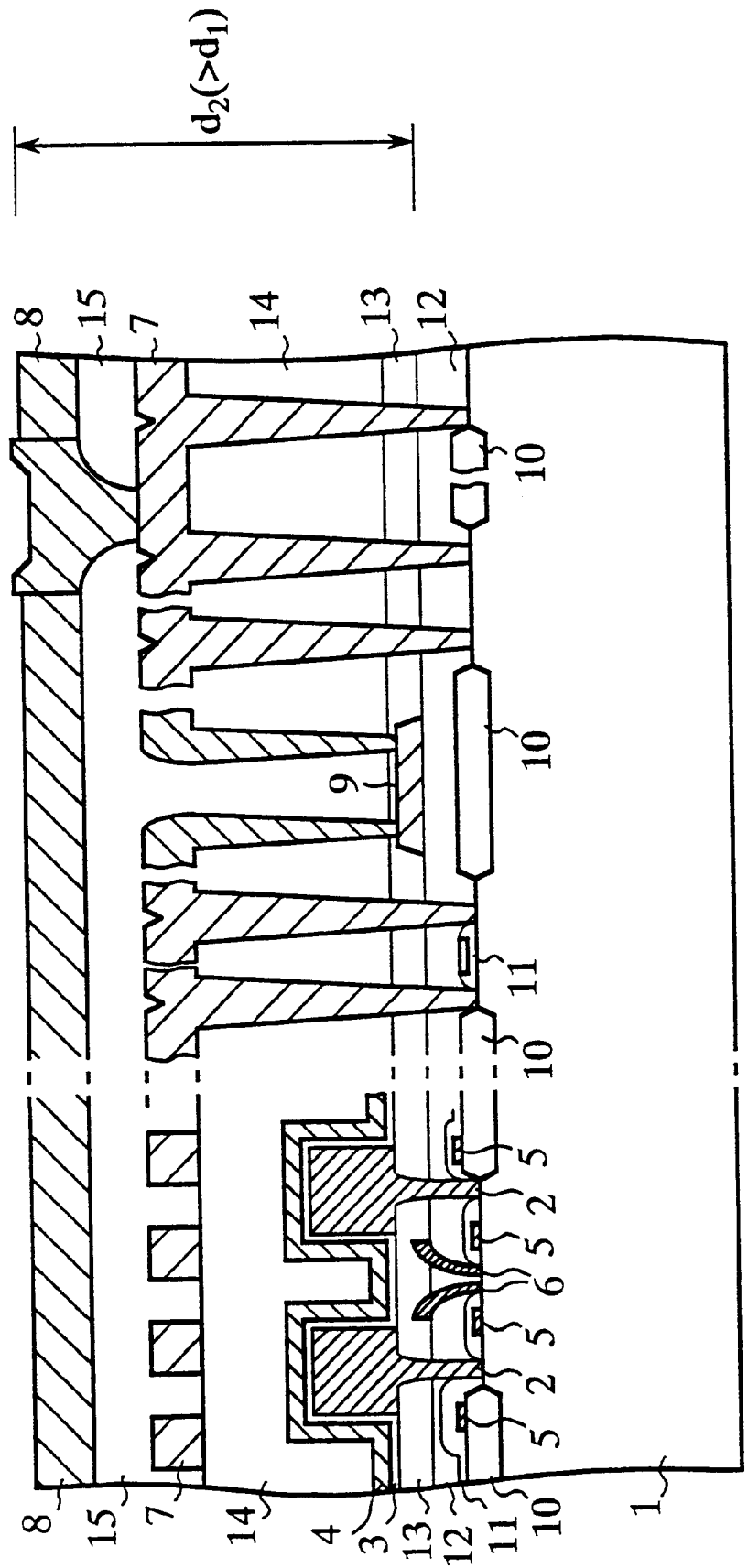
FIG. 10 is a diagram showing a sectional view of another conventional semiconductor integrated circuit (DRAM)
Figure 11A:
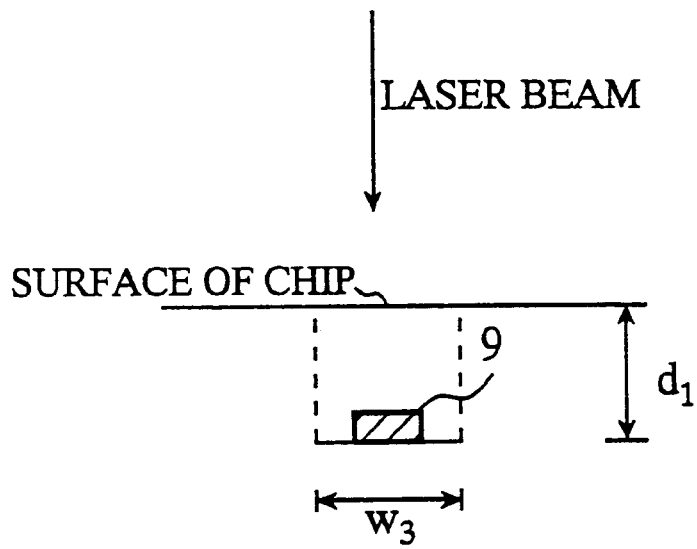
FIGS. 11A and 11B are diagrams explaining a drawback involved in the conventional semiconductor integrated circuit shown in FIG. 10.
Figure 11B:
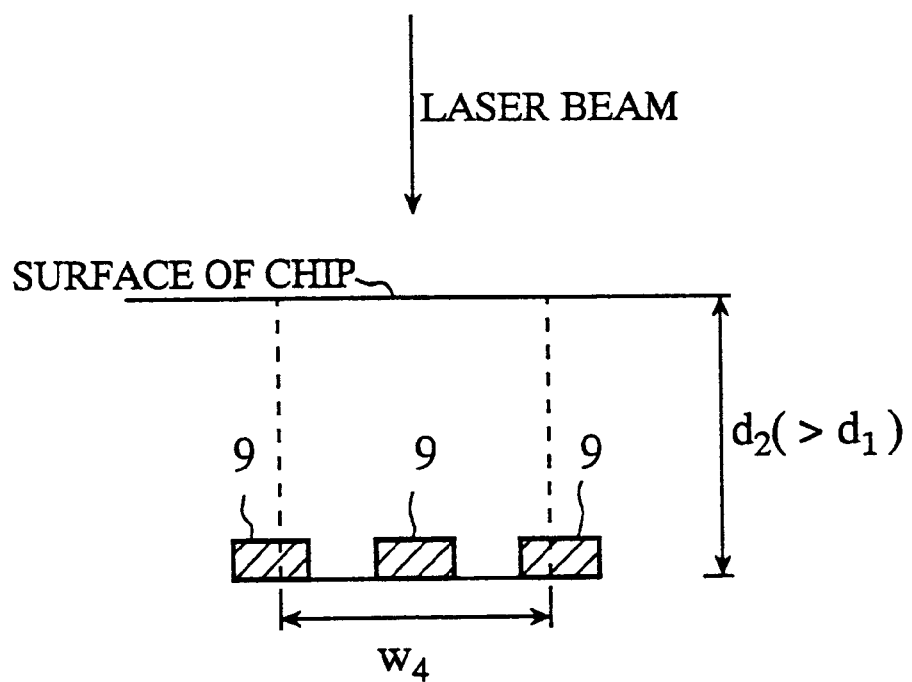

FIG. 7 is a diagram showing a sectional view of the semiconductor integrated circuit (DRAM) as the fourth embodiment according to the present invention. In FIG. 7, the reference number 81 designates a second line layer formed on an insulating layer 15 that is also formed on the insulating layer 14, and 82 denotes a second layer to layer line, made up of tungsten or poly-silicon, that electrically connects the second line layer 81, the first line 7, and the like.

In the DRAM of the fourth embodiment shown in FIG. 7, the second line 8 comprises the second line layer 81 and the second layer to layer line 82. The reference number 9 designates a fuse element formed on the same level as the second line 8 and formed in the same fabrication process the second line 8. That is, the second layer to layer line 82 is made up of the tungsten or the poly-silicon layer formed on the insulating layer 15. The fuse element 9 is made up of the tungsten or the poly-silicon layer formed on the insulating layer 15. The second line layer 82 is made up of the aluminum layer formed on the insulating layer 15. Other components of the DRAM of the fourth embodiment are the same as those of the DRAM of the third embodiment. Therefore the same reference numbers of the same components will be used and the explanation of them is omitted here for brevity.

In the DRAM of the fourth embodiment having the configuration described above, when a laser beam blows the fuse element 9 in the DRAM shown in FIG. 7, a hole is formed in the fuse element 9. The diameter of the hole is approximately equal to the hole formed in the conventional one. Accordingly, it is possible to increase the integration of the semiconductor integrated circuit, namely the DRAM having the configuration shown in FIG. 7, because it is not required to increase the interval between adjacent fuse elements. Furthermore, because it is not required to blow the fuse element 9 in depth, the blowing time of the laser beam to the fuse element 9 can be reduced.

As described above, because the semiconductor integrated circuit of the fourth embodiment has a configuration in which the surface of the insulating layer 14 formed on the semiconductor substrate 1 and the capacitor made up of the electrodes 2, 4 and the insulating layer 3 is approximately smoothed by using the chemical mechanical polishing process, and because the fuse element 9 is formed over the insulating layer 14 in a laminating direction, it is possible to increase the integration of the semiconductor integrated circuit without any influence caused by holes generated by an off-focus of the laser beam and a laser blowing process. Accordingly, because it is possible to form both the memory cell sections 16 and the logical section 17 in a same semiconductor chip without preventing a high integration of the logical section 17 shown in FIG. 2. This provides a semiconductor memory of a high integration including a mixed logic section without any influence caused by holes generated by an off-focus of the laser beam and a laser blowing process.

In addition, according to the DRAM of the fourth embodiment of the present invention, because the second line 8 comprises the second layer 81 of aluminum and the second layer to layer line 82 of tungsten or poly-silicon, the resistance of the second line 8 in the DRAM of the fourth embodiment is smaller than that of the first line in the DRAM of the first embodiment. It is thereby possible to obtain the same characteristic of the second line made up of only aluminum in a conventional semiconductor integrated circuit.

Furthermore, in the semiconductor integrated circuit according to the fourth embodiment, because both the fuse element 9 and the second line 8 are formed in the same fabrication process, it is possible to reduce the number of fabrication processes when compared with the conventional fabrication method in which a dedicated fabrication process for the fuse 9 must be required.

As set forth, according to the present invention, because the fuse element is formed after the insulating layer has been formed on the capacitor and the semiconductor substrate, even if a thicker insulating layer is formed on the capacitor, the fuse is arranged and formed on a shallow position observed from the surface of the semiconductor chip. Accordingly, even if the surface of the thicker insulating layer formed on the capacitor is smoothed, it is easily possible to blow the fuse element by using a laser beam. In addition to this effect, it is possible to reduce a hole in the semiconductor integrated circuit to be formed by blowing of the laser beam. Accordingly, it is not required to have a large interval between adjacent fuse elements, so that it is possible to provide the semiconductor integrated circuit with a high integration.

In addition, according to the present invention, because the surface of the insulating layer is smoothed by using a chemical mechanical polishing process after the insulating layer has been laminated so that the insulating layer covers the capacitor and the semiconductor substrate, it is prevented to happen off-focus phenomenon caused in processes following after the insulating layer fabrication process.

Furthermore, according to the present invention, because the semiconductor integrated circuit has the configuration in which the capacitor is formed on the semiconductor substrate, the insulating layer is formed on the capacitor and the semiconductor substrate, and the fuse element is formed on or over the insulating layer in laminating direction, it is possible to provide the semiconductor integrated circuit with a high integration.

Moreover, according to the present invention, because both the fuse element and the wiring are formed in a same fabrication process, it is possible to reduce the number of the fabrication processes of the semiconductor integrated circuit without any adding a dedicated fabrication process for fabricating the fuse element.

In addition, according to the present invention, because both the fuse element and the wiring formed over the capacitor in laminating direction are formed by a same material, it is possible to fabricate both the fuse element and the wiring in a same fabrication process, so that it is possible to reduce the number of the fabrication processes of the semiconductor integrated circuit without any adding a dedicated fabrication process for fabricating the fuse element.

Furthermore, according to the present invention, because both the fuse element and the layer to layer line (wiring) to be used for the connection of different wiring layers are formed in a same wiring fabrication process, it is possible to reduce the number of the fabrication processes of the semiconductor integrated circuit without any adding a dedicated fabrication process for fabricating the fuse element.

Moreover, according to the present invention, because the wiring layers are made up of tungsten or poly-silicon and the like, it is possible to reduce the magnitude of the resistance of each wiring layer.

Furthermore, according to the present invention, because the wiring to be formed on or over the capacitor comprises a plurality of wiring layers and layer to layer lines to connect the plurality of the wiring layers, and the fuse element comprises the same component of the layer to layer lines, it is possible to provide the semiconductor integrated circuit with a high integration.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit comprising:

a semiconductor substrate;

a capacitor disposed on said semiconductor substrate;

an insulating layer disposed on said capacitor and on said semiconductor substrate, said insulating layer having a substantially planar surface smoothed by chemical mechanical polishing; and a fuse element disposed on the substantially planar surface of said insulating layer.

2. The semiconductor integrated circuit as claimed in claim 1, comprising a wiring layer having a wiring portion disposed on said insulating layer and a layer-to-layer wiring portion disposed in a contact hole extending through said insulating layer, wherein said fuse element comprises a material and at least one of said wiring portion and said layer-to-layer wiring portion comprises the same material as said fuse element.

3. A semiconductor integrated circuit comprising:

a semiconductor substrate;

a capacitor disposed on said semiconductor substrate;

an insulating layer disposed on said capacitor and said semiconductor substrate;

a fuse element disposed on said insulating layer;

a plurality of first wiring layers located opposite said capacitor, on said insulating layer; and first layer-to-layer wiring connecting said plurality of first wiring layers, said first layer-to-layer wiring comprising a first material located in said insulating layer, and wherein said fuse element comprises said first material.

4. A semiconductor integrated circuit comprising:

a semiconductor substrate;

a capacitor disposed on said semiconductor substrate;

an insulating layer disposed on said capacitor and said semiconductor substrate;

a fuse element disposed on said insulating layer;

a plurality of first wiring layers located opposite said capacitor, on said insulating layer;

first layer-to-layer wiring connecting said plurality of first wiring layers, said first layer-to-layer wiring comprising a first material located in said insulating layer;

a plurality of second wiring layers located opposite said capacitor, on said insulating layer; and second layer-to-layer wiring connecting said plurality of second wiring layers, said second layer-to-layer wiring comprising a second material located in said insulating layer, wherein said fuse element comprises said first material.

5. A semiconductor integrated circuit comprising:

a semiconductor substrate;

a capacitor disposed on said semiconductor substrate;

an insulating layer disposed on said capacitor and said semiconductor substrate;

a fuse element disposed on said insulating layer;

a plurality of first wiring layers located opposite said capacitor on said insulating layer;

first layer-to-layer wiring connecting said plurality of first wiring layers, said first layer-to-layer wiring comprising a first material located in said insulating layer;

a plurality of second wiring layers located opposite said capacitor, on said insulating layer; and second layer-to-layer wiring connecting said plurality of second wiring layers, said second layer-to-layer wiring comprising a second material located in said insulating layer, wherein said fuse element comprises said second material.

* * * * *